(12) United States Patent
Zhou

(10) Patent No.: US 7,106,083 B2
(45) Date of Patent: Sep. 12, 2006

(54) TESTING SYSTEM AND TESTING METHOD FOR DUTS

(75) Inventor: Jing-Rong Zhou, Chandler, AZ (US)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/905,339

(22) Filed: Dec. 29, 2004

(65) Prior Publication Data

US 2006/0139047 A1 Jun. 29, 2006

(51) Int. Cl.
*G01R 31/26* (2006.01)
(52) U.S. Cl. ............... 324/763; 324/765; 324/73.1
(58) Field of Classification Search ............... None
See application file for complete search history.

(56) References Cited

U.S. PATENT DOCUMENTS

| | | | | |
|---|---|---|---|---|
| 5,389,556 A | * | 2/1995 | Rostoker et al. | 438/17 |
| 5,442,282 A | * | 8/1995 | Rostoker et al. | 324/158.1 |
| 5,898,186 A | * | 4/1999 | Farnworth et al. | 257/48 |
| 6,759,865 B1 | * | 7/2004 | Gu et al. | 324/765 |

\* cited by examiner

*Primary Examiner*—Minh N. Tang
(74) *Attorney, Agent, or Firm*—Winston Hsu

(57) ABSTRACT

A device characteristic testing system for testing a first DUT (device under test), a second DUT, a third DUT and a fourth DUT on a wafer, each of the DUTs includes a first end and a second end, the device characteristic testing system includes: a device characteristic testing circuit formed on the wafer includes a first conducting line connected to the second end of the first and the fourth DUT, a second conducting line connected to the second end of the second and third DUTs, a third conducting line connected to the first end of the first and second DUTs, a fourth conducting line connected to the first end of the third and fourth DUT, and a plurality of testing pads respectively coupled to the first, second, third, and fourth conducting line for receiving at least one testing signal to detect device characteristics of the DUTs.

15 Claims, 4 Drawing Sheets

TESTING SYSTEM AND TESTING METHOD FOR DUTS

BACKGROUND OF INVENTION

1. Field of the Invention

The invention relates to a testing system and a testing method for DUTs (devices under test), and more particularly, to a testing system and a testing method having fewer testing pads for DUTs.

2. Description of the Prior Art

It is well-known that, in the manufacturing process of ICs (integrated circuits) and chips, a testing operation is a commonly used step. Each IC, whether the IC is in the wafer state or in the packaging state, has to be tested through a standard testing procedure to ensure functions of each circuit of the IC. Generally speaking, accuracy and speed of a testing procedure are required because of two main concerns: new design of ICs and yield. For example, as IC design progresses, the ICs may have more functions, meaning that the inner circuits of the ICs become more complicated. Therefore, the accuracy of the testing procedure also becomes more essential.

The testing procedure of testing a single die of a wafer in the above-mentioned wafer state is also called wafer probing. As known by those skilled in the art, wafer probing is an essential test in manufacturing, and it is mainly used to detect device characteristics of each die on the wafer by establishing a temporary electronic contact between an external testing device and the dies on the wafer. Therefore, good ICs (that is, the produced ICs that conform to the needed specification) are selected from the whole wafer before all dies are separated and packaged. Furthermore, the yield of the wafer can be determined through the wafer probing. Therefore, engineers could know the problems of wafer manufacturing by analyzing the yield. In other words, if the yield is a high percentage, this means that the manufacturing procedure is correct, otherwise, if the yield is a low percentage, this means that some problems may have occurred in the manufacturing procedure and some steps of the manufacturing procedure need to be examined again.

Please refer to FIG. 1, which is a diagram of a testing circuit 100 according to the prior art. As shown in FIG. 1, the testing circuit 100 comprises a plurality of DUTs (devices under test) 110, 120, 130, 140 and a plurality of testing pads 150, 160, 170, 180, 190, wherein the DUTs 110, 120, 130, 140 and the testing pads 150, 160, 170, 180, 190 are electrically connected in series. That is, every two DUTS of DUTs 110, 120, 130, 140 share one testing pad of testing pads 150, 160, 170, 180, 190. As known by those skilled in the art, the testing circuit 100 is positioned on a wafer. That is, the testing pads 150, 160, 170, 180, 190 and related conducting lines are formed in the same wafer through a semiconductor manufacturing procedure. In general, the above-mentioned testing pads 150, 160, 170, 180, 190 are metal welded pads or touched by probe pins for establishing the electronic contact between the external testing device (not shown in FIG. 1) and the DUTs 110, 120, 130, 140. Therefore, in the testing operation, the external testing device can establish a testing voltage (or a testing current) on each DUT 110, 120, 130, 140 through the testing pads 150, 160, 170, 180, 190, and detect the corresponding current (or corresponding voltage) in order to detect the device characteristics (for example, the impedance) of the DUTs 110, 120, 130, 140.

However, there is a serious disadvantage in the testing circuit 100 shown in FIG. 1. Because the DUTs 110, 120, 130, 140 and testing pads 150, 160, 170, 180, 190 are connected in series, as shown in FIG. 1, 4 DUTs need 5 testing pads. Following the above illustration, K DUTs need K+1 testing pads on the wafer. Therefore, the testing circuit according to the prior art occupies a huge wafer area because of the huge number of testing pads. In addition, the testing circuit in the prior art also limits the number of DUTs due to the consumption of the wafer area.

SUMMARY OF INVENTION

It is therefore a primary objective of the claimed invention to provide a testing system and related testing method having fewer testing pads for DUTs, to solve the above-mentioned problem of requiring a huge number of testing pads.

According to an exemplary embodiment of the claimed invention, a testing system for testing a first DUT (device under test), a second DUT, a third DUT, and a fourth DUT on a wafer is disclosed, where each of the first, second, third, and fourth DUTs comprises a first testing end and a testing end. The testing system comprises: a testing circuit formed on the wafer comprising: a first conducting line connected to the second testing end of the first and the fourth DUTs; a second conducting line connected to the second testing ends of the second and third DUTs; a third conducting line connected to the first testing ends of the first and second DUTs; a fourth conducting line connected to the first testing end of the third and fourth DUT; and a plurality of testing pads respectively coupled to the first, second, third, and fourth conducting lines for receiving at least one testing signal to detect device characteristics of the first, second, third, and fourth DUTs.

Furthermore, a testing method for testing a first DUT, a second DUT, a third DUT, and a fourth DUT on a wafer is disclosed, where each of the first, second, third, and fourth DUTs comprises a first testing end and a second end. The testing method comprises: connecting the second testing end of the first and fourth DUT to a first conducting line; connecting the second testing ends of the second and third DUTs to a second conducting line; connecting the first end of the first and second DUTs to a third conducting line; connecting the first end of the third and fourth DUTs to a fourth conducting line; providing a plurality of testing pads respectively coupled to the first, second, third, and fourth conducting lines; and utilizing the testing pads to receive at least one testing signal to detect device characteristics of the first, second, third, and fourth DUTs.

In addition, a method for arranging testing pads on a wafer is disclosed, where the wafer comprises a first DUT (device under test), a second DUT, a third DUT, and a fourth DUT. Each of the first, second, third, and fourth DUT comprising a first testing end and a second testing end. The method comprises: coupling a first testing pad to the second ends of the first and fourth DUTs; coupling a second testing pad to the second ends of the second and third DUTs; coupling a third testing pad to the first ends of the first and second DUTs; and coupling a fourth testing pad to the first ends of the third and fourth DUTs.

Furthermore, a testing system for testing a plurality of DUTs (device under test) on a wafer is disclosed, where the plurality of DUTs are arranged in an n*m matrix, and each DUT has a row testing end and a column testing end. The testing system comprises: n row testing pads for receiving a testing signal, wherein a row testing pad of the first row is coupled to the row testing ends of the DUTs arranged on the first row, and a row testing pad of the $n_{th}$ row is coupled to the row testing ends of the DUTs arranged on the $n_{th}$ row; and m column testing pads for receiving a testing signal, wherein a column testing pad of the first column is coupled to the column testing ends of the DUTs arranged on the first column, and a column testing pad of the $m_{th}$ column is coupled to the column testing ends of the DUTs arranged on the $m_{th}$ column; wherein m is not less than 2, and m is not less than 2.

In addition, a method for arranging testing pads on a wafer is disclosed. The method comprises: arranging a plurality of DUTs in a n*m matrix, wherein each DUT has a row testing end and a column testing end; providing n row testing pads, coupling a row testing pad of the first row to the row testing ends of the DUTs arranged on the first row, and coupling a row testing pad of the $n_{th}$ row is coupled to the row testing ends of the DUTs arranged on the $n_{th}$ row; and providing $m_{th}$ column testing pads, coupling a testing pad of the first column to the column testing ends of the DUTs arranged on the first column, and coupling a testing pad of the $m_{th}$ column is coupled to the column testing ends of the DUTs arranged on the $m_{th}$ column; wherein n is not less than 2, and m is not less than 2.

It is one advantage of the present invention that if there are M*N DUTs, only M+N testing pads are needed. Therefore, the wafer area is saved. Furthermore, the present invention testing system and testing method further discloses a look-up table. So the loop-up table, which is composed of electronic parameters, can directly be utilized to quickly detect an abnormal electronic parameter and the corresponding DUT. This increases the speed of searching an abnormal DUT.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
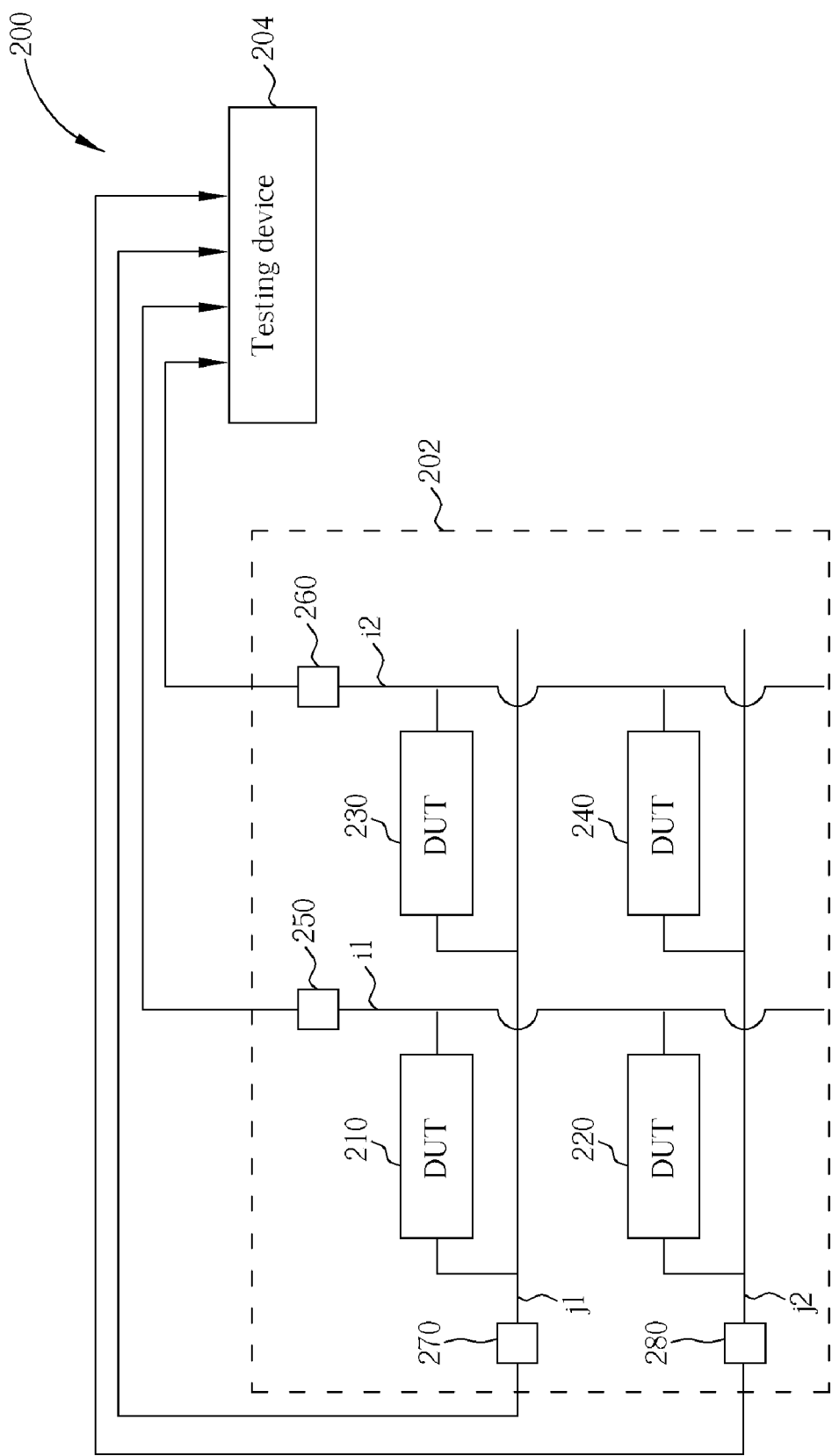
FIG. 2 is a diagram of a testing system according to the present invention.

Please refer to FIG. 2, which is a diagram of a testing system 200 according to the present invention. The testing system 200 comprises a testing circuit 202, and a testing device 204. The testing system 200 is used to test a plurality of DUTs 210, 220, 230, 240 on a wafer (not shown in FIG. 2). Please note that only 4 DUTs are shown in FIG. 2 for simplicity. The testing circuit 202 is positioned on the same wafer through semiconductor manufacturing procedure, wherein the testing circuit comprises a plurality of testing pads 250, 260, 270, 280, a plurality of vertical conducting lines i1, i2, and a plurality of horizontal conducting lines j1, j2. As shown in FIG. 2, the DUTs 210, 220, 230, 240 are equivalently electrically connected in a 2*2 matrix, wherein the right ends of the DUTs 230, 240 are connected to the testing pad 260 through the vertical conducting line i2, the right ends of the DUTs 210, 220 are connected to the testing pad 250 through the vertical conducting line i1, the left ends of the DUTs 210, 230 are connected to the testing pad 270 through the horizontal conducting line j1, the left ends of the DUTs 220, 240 are connected to the testing pad 280 through the horizontal conducting line j2.

Figure 1:
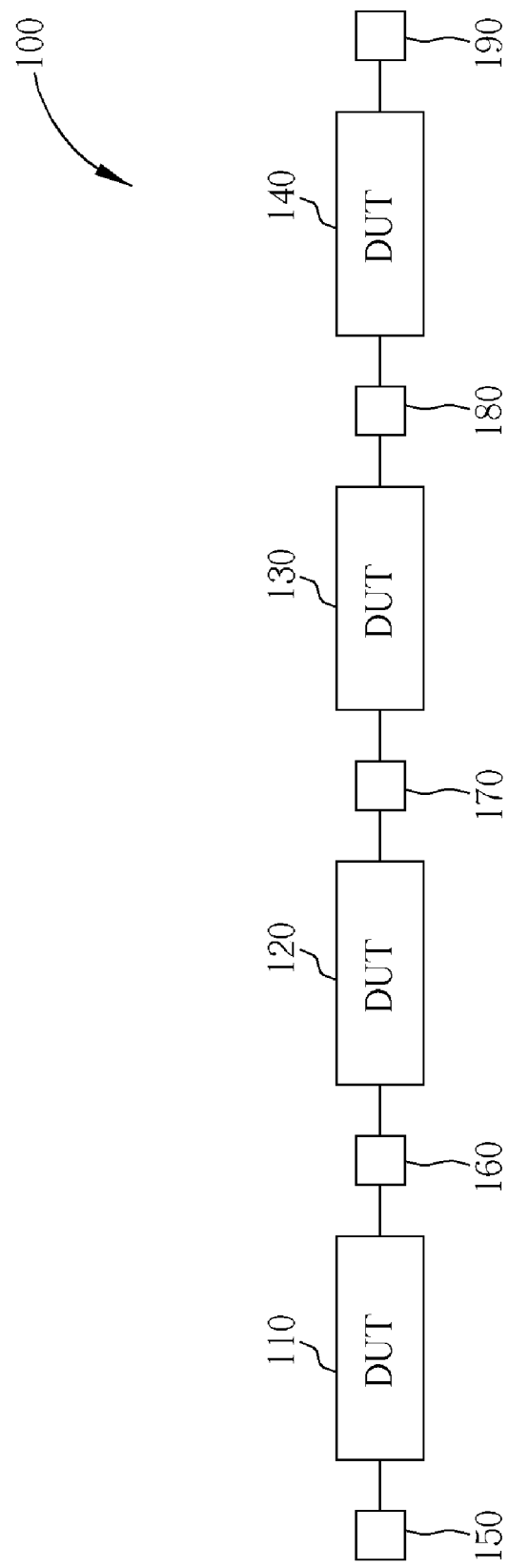
FIG. 1 is a diagram of a testing circuit according to the prior art.
Figure 3:
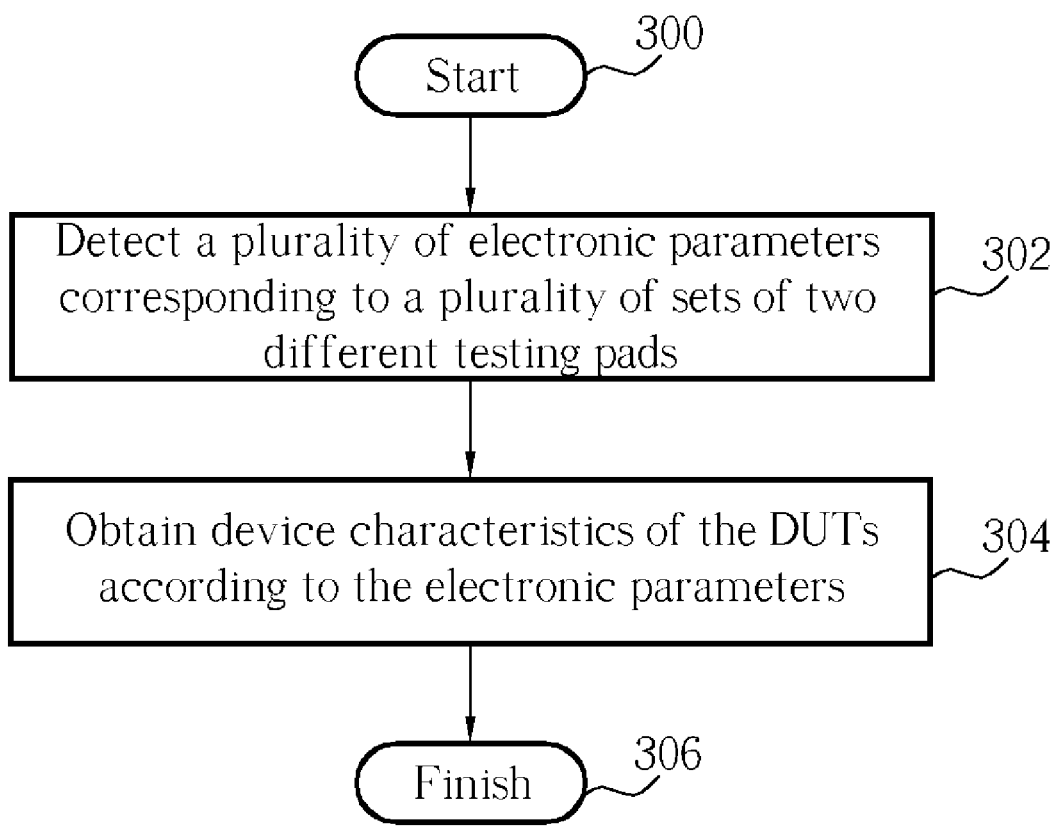
FIG. 3 is a flow chart of testing the DUTs of the testing system shown in FIG. 1.

Please refer to FIG. 3, which is a flow chart of testing the DUTs 210, 220, 230, 240 of the testing system 200 shown in FIG. 1. The operation of testing the DUTs 210, 220, 230, 240 comprises following steps:

Step 300: Start;

Step 302: Detect a plurality of electronic parameters corresponding to a plurality of sets of two different pads 250, 260, 270, 280;

Step 304: Obtain device characters (for example, the impedances) of the DUTs 210, 220, 230, 240 according to the electronic parameters; and Step 306: Finish.

The detailed illustration of the operation of the testing system is described as follows. First, the external testing device 204 establishes a temporary electronic contact between the external testing device 204 and the testing circuit 202 through the testing pads 250, 260, 270, 280 (step 300). And then, the testing device 204 inputs a testing signal (a known voltage or a known current) to the testing circuit 202, and further detects a plurality of electronic parameters corresponding to a plurality of sets of two different testing pads 250, 260, 270, 280 (step 302). For example, the testing device 202 can establish a voltage $V_d$ between two testing pads 250, 270. In this embodiment, the testing device 204 makes the other two testing pads 260, 280 floating, grounds the testing pad 270, and inputs a voltage level $V_d$ to the testing pad 250. Therefore, the needed voltage $V_d$ between 250, 270 is established. At last, the testing device 202 can receive a corresponding current $I_{i1j1}$ between the testing pads 250, 270.

As known by those skilled in the art, the relationship between voltage $V_d$ and the current $I_{i1j1}$ can be shown by the following equation (1):

$$I_{i1j1}=V_d/R_{i1j1}=V_d/[R_{210}//(R_{220}+R_{230}+R_{240})] \quad \text{equation (1)}$$

In equation (1), the symbol // represents parallel connection, $R_{i1j1}$ represents a equivalent impedance between the testing pads 250, 270, and $R_{210}$, $R_{220}$, $R_{230}$, $R_{240}$ represent the impedances of the DUTs 210, 220, 230, 240.

Similarly, the above-mentioned operations can be performed to get following equations (2), (3), (4):

$$I_{i1j2}=V_d/R_{i1j2}=V_d/[R_{220}//(R_{210}+R_{230}+R_{240})] \quad \text{equation (2)}$$

$$I_{i2j1}=V_d/R_{i2j1}=V_d/[R_{230}//(R_{210}+R_{220}+R_{240})] \quad \text{equation (3)}$$

$$I_{i2j2}=V_d/R_{i2j2}=V_{id}/[R_{240}//(R_{210}+R_{220}+R_{230})] \quad \text{equation (4)}$$

Here, because the voltage is $V_d$ given and the currents $I_{i1j1}$, $I_{i1j2}$, $I_{i2j1}$, $I_{i2j2}$ can be detected by the testing device 204, four unknown impedances $R_{210}$, $R_{220}$, $R_{230}$, $R_{240}$ can be easily calculated through above-mentioned equations (1), (2), (3), (4) (step 304). Therefore, the testing device 204 finally calculates the corresponding impedances $R_{210}$, $R_{220}$, $R_{230}$, $R_{240}$ of the DUTs 210, 220, 230, 240 so that the testing operation is completed (step 306).

Therefore, calculated impedances $R_{210}$, $R_{220}$, $R_{230}$, $R_{240}$ can be used for comparing with a predetermined impedance, which is specified by an IC specification, to know whether each of the DUTs 210, 220, 230, 240 has abnormal device characteristics and to know whether errors occur in the manufacturing procedure. Please note that in the above-mentioned embodiment, the testing device 204 controls the voltage level of the input testing signal and detects the current between the two testing pads in order to calculate the impedance of a DUT. However, the testing device 204 can input a current signal instead of a voltage signal, and detect the voltage between two testing pads instead of detecting the current. The impedance of the DUT can also be calculated. This is also in line with the spirit of the present invention.

In addition, the testing device 204 can store the detected electronic parameters (such as currents) in a look-up table in order to know whether a DUT has an abnormal device characteristic. Please refer to FIG. 4, which is a diagram of a look-up table 400 recorded by the testing device 204 shown in FIG. 2. Please note that the number of DUTs here is assumed to be 100 for simplification, and the DUTs are connected in a 10*10 matrix. Furthermore, each DUT has the same ideal impedance.

Figure 4:
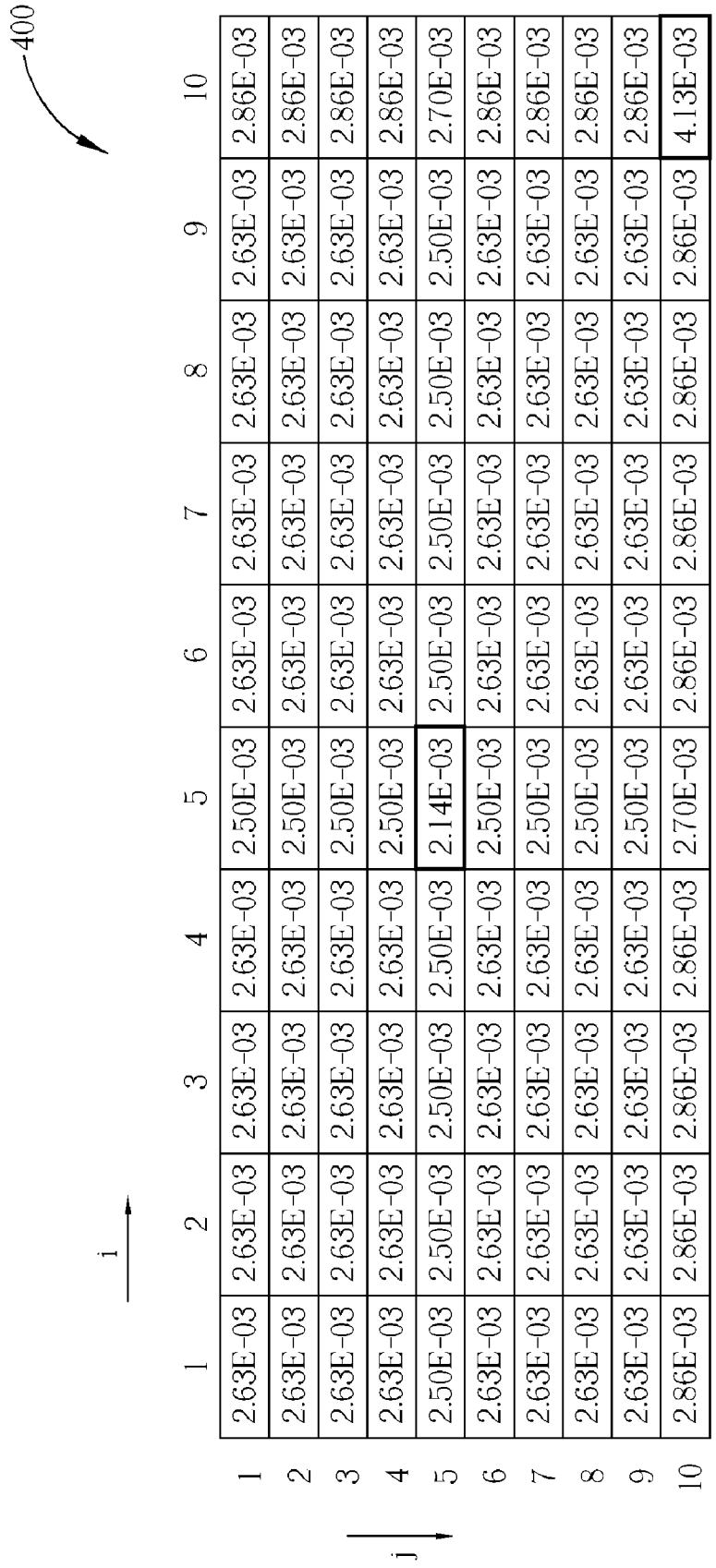
FIG. 4 is a diagram of a look-up table recorded by the testing device shown in FIG. 2.

It can be easily seen in FIG. 4 that when the testing device 204 establishes an appropriate voltage on the testing circuit 202, the testing device 204 can detect an actual current. Therefore, after the above-mentioned operation, the testing device 204 can detect corresponding current between two different pads ($P_i$, $P_j$), wherein i represents the number of vertical conducting lines of the 10*10 matrix, and j represents the number of horizontal conducting lines of the 10*10 matrix.

Now looking at line 5 (i=5) and row 5 (j=5) in FIG. 4, the current values in line 5 and row 5 are 2.50E-03, which is smaller than a normal current value 2.63E-03. And the cross of line 5 and row 5 (i=5 and j=5) has the smallest current value 2.14E-03 because the corresponding DUT, which is connected to $5^{th}$ vertical conducting line and $5^{th}$ horizontal conducting line of the 10*10 matrix (i=5 and j=5), has too of an large impedance so that the corresponding current value is too small.

On the other hand, the current values in line 10 and current values in row 10 are 2.86E-03, which is larger than a normal current value 2.63E-03. And the cross of line 10 and row 10 (i=10 and j=10) has the largest current value 4.13E-03 because the corresponding DUT, which is connected to $10^{th}$ vertical conducting line and $10^{th}$ horizontal conducting line of the 10*10 matrix (i=10 and j=10), has too small of an impedance so that the corresponding current value is too large.

Therefore, the present invention can directly utilize the above-mentioned look-up table 400 to find out abnormal DUTs, and utilizes the position of the abnormal electronic parameters in the look-up table 400 to find out the corresponding position of the abnormal DUTs of the testing circuit 202. This raises the searching speed of the abnormal DUTs.

Please note that in the above-mentioned disclosure, the DUTs are electrically connected in a square, however, the present invention does not limit the arrangement and the number of the DUTs in the testing circuit 202. For example, M*N DUTs can be electrically connected in an M*N matrix. In other words, the above-mentioned square configuration is only used for illustration, and is not a limitation. In addition, the position of the testing pads of the testing circuit 202 and the circuit layout can be changed corresponding to the positions of probes of the testing device 204. The circuit structure of the testing circuit 202 shown in FIG. 2 is only a preferred embodiment of the present invention, not a limitation of the present invention.

Please note that the currents $I_{i1j1}$, $I_{i1j2}$, $I_{i2j1}$, $I_{i2j2}$, which are used for calculating the impedances of the DUTs, are only used as a preferred embodiment of the present invention. In other words, other currents $I_{i1i2}$, $I_{j1j2}$ can also be used for calculating the impedances of the DUTs. That is, when the device characteristics of the DUTs are calculated, the currents $I_{i1j1}$, $I_{i1j2}$, $I_{i2j1}$, $I_{i2j2}$, $I_{i1j2}$, $I_{j1j2}$ can be selected according to design requirements.

In the prior art testing circuit, if there are M*N DUTs, M*N+1 testing pads are used. However, in contrast to the prior art, the present invention testing circuit only needs M+N testing pads so that the wafer area is saved. Furthermore, the present invention testing system and the testing method further disclose a look-up table. The present invention can directly utilize the look-up table, which is composed of electronic parameters, to quickly detect abnormal DUTs and corresponding positions so that the searching speed of the abnormal DUTs is raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing system for testing a first DUT (device under test), a second DUT, a third DUT, and a fourth DUT on a wafer, each of the first, second, third, and fourth DUTs comprising a first testing end and a second testing end, the testing system comprising:
   a testing circuit formed on the wafer comprising:
   a first conducting line connected to the second testing ends of the first and the fourth DUTs;
   a second conducting line connected to the second testing ends of the second and third DUTs;
   a third conducting line connected to the first testing ends of the first and second DUTs;
   a fourth conducting line connected to the first testing ends of the third and fourth DUTs;
   a first testing pad coupled to the first conducting line;
   a second testing pad coupled to the second conducting line;
   a third testing pad coupled to the third conducting line; and
   a fourth testing pad coupled to the fourth conducting line;
   wherein the first, second, third, and fourth testing pads receive at least one testing signal to detect device characteristics of the first, second, third, and fourth DUTs, and when the first and second testing pads transfer a first testing signal, the third and fourth testing pads are floating.

2. The testing system of claim 1 further comprising:
   a testing device coupled to the first, second, third, and fourth testing pads for detecting a plurality of electronic parameters corresponding to a plurality of sets of two different testing pads and obtaining the device characteristics of the first, second, third, and fourth DUTs, wherein the sets of different testing pads include a set of the first and second testing pads.

3. The testing system of claim 2, wherein the testing device calculates the device characteristics of the first, second, third, and fourth DUTs by calculating the detected electronic parameters through an equation.

4. The testing system of claim 1, wherein the first, second, third, and fourth DUTs are arranged in a matrix.

5. A testing method for testing a first DUT, a second DUT, a third DUT, and a fourth DUT on a wafer, each of the first, second, third, and fourth DUTs comprising a first testing end and a second testing end, the testing method comprising:
   connecting the second testing ends of the first and fourth DUTs to a first conducting line;

connecting the second testing ends of the second and third
DUTs to a second conducting line;
connecting the first testing ends of the first and second
DUTs to a third conducting line;
connecting the first testing ends of the third and fourth
DUTs to a fourth conducting line;
coupling a first testing pad to the first conducting line;
coupling a second testing pad to the second conducting
line;
coupling a third testing pad to the third conducting line;
coupling a fourth testing pad to the fourth conducting line;
and
utilizing the first, second, third, and fourth testing pads to
receive at least one testing signal to detect device
characteristics of the first, second, third, and fourth
DUTs, and when the first and second testing pads are
utilized to transfer a first testing signal, floating the
third and fourth testing pads.

6. The testing method of claim 5, wherein the step of utilizing the testing pads to detect the device characteristics of the first, second, third DUTs further comprises:
detecting a plurality of electronic parameters corresponding to a plurality of sets of two different testing pads; and
obtaining the device characteristics of the first, second, third, and fourth DUTs according to the electronic parameters;
wherein the sets of different testing pads include a set of the first and second testing pads.

7. The testing method of claim 6, wherein the step of obtaining the device characteristics of the first, second, third, and fourth DUTs further comprises:
calculating the device characteristics of the first, second, third, and fourth DUTs by calculating the detected electronic parameters through an equation.

8. A testing system for testing a plurality of DUTs (device under test) on a wafer, the plurality of DUTs arranged in an n*m matrix, each DUT having a row testing end and a column testing end, and the testing system comprising:
n row testing pads each for receiving a testing signal, wherein n is not less than 2, a row testing pad of a first row is coupled to the row testing ends of the DUTs arranged on the first row, and a row testing pad of an nth row is coupled to the row testing ends of the DUTs arranged on the nth row; and
m column testing pads each for receiving a testing signal, wherein m is not less than 2, a column testing pad of a first column is coupled to the column testing ends of the DUTs arranged on the first column, and a column testing pad of an mth column is coupled to the column testing ends of the DUTs arranged on the mth column;
wherein the testing pads receive at least one testing signal to detect device characteristics of the plurality of DUTs, and when two specific row testing pads of the n row testing pads transfer a testing signal, the other testing pads are floating or when two column testing pads of the m column testing pads transfer a testing signal, the other testing pads are floating.

9. The testing system of claim 8 further comprising:
a testing device coupled to the n row testing pads and the m column testing pads for detecting a plurality of electronic parameters corresponding to a plurality of sets of two different testing pads and obtaining the device characteristics of the plurality of DUTs, wherein the sets of two different testing pads include one set of either the two specific row testing pads or the two specific column testing pads.

10. The testing system of claim 9, wherein the testing device calculates the device characteristics of the plurality of DUTs by calculating the detected electronic parameters through an equation.

11. A testing method for testing a plurality of DUTs (device under test) on a wafer comprising:
arranging the plurality of DUTs in an n*m matrix, wherein each DUT has a row testing end and a column testing end;
providing n row testing pads, coupling a row testing pad of a first row to the row testing ends of the DUTs arranged on the first row, and coupling a row testing pad of an $n_{th}$ row to the row testing ends of the DUTs arranged on the $n_{th}$ row, wherein n is not less than 2;
providing m column testing pads, coupling a testing pad of a first column to the column testing ends of the DUTs arranged on the first column, and coupling a testing pad of an $m_{th}$ column to the column testing ends of the DUTs arranged on the $m_{th}$ column, wherein m is not less than 2;
utilizing the testing pads to receive at least one testing signal to detect device characteristics of the plurality of DUTs, and when utilizing two specific row testing pads of the n row testing pads to transfer a testing signal, floating the other testing pads, or when utilizing two column testing pads of the m column testing pads to transfer a testing signal, floating the other testing pads.

12. A testing system for testing a first DUT (device under test), a second DUT, a third DUT, and a fourth DUT on a wafer, each of the first, second, third, and fourth DUTs comprising a first testing end and a second testing end, the testing system comprising:
a testing circuit formed on the wafer comprising:
a first conducting line connected to the second testing ends of the first and the fourth DUTs;
a second conducting line connected to the second testing ends of the second and third DUTs;
a third conducting line connected to the first testing ends of the first and second DUTs;
a fourth conducting line connected to the first testing ends of the third and fourth DUTs;
a plurality of testing pads respectively coupled to the first, second, third, and fourth conducting lines for receiving at least one testing signal to detect device characteristics of the first, second, third, and fourth DUTs; and
a testing device, coupled to the testing pads, for detecting a plurality of electronic parameters corresponding to a plurality of sets of two different testing pads and comparing the electronic parameters to detect a specific device from the first, second, third, and fourth DUTs.

13. A testing method for testing a first DUT, a second DUT, a third DUT, and a fourth DUT on a wafer, each of the first, second, third, and fourth DUTs comprising a first testing end and a second end, the testing method comprising:
connecting the second testing end of the first and fourth DUT to a first conducting line;
connecting the second testing ends of the second and third DUTs to a second conducting line;
connecting the first end of the first and second DUTs to a third conducting line;
connecting the first end of the third and fourth DUTs to a fourth conducting line;
providing a plurality of testing pads respectively coupled to the first, second, third, and fourth conducting lines; and detecting a plurality of electronic parameters corresponding to a plurality of sets of two different testing pads and comparing the electronic parameters to detect a specific device from the first, second, third, and fourth DUTs.

14. A testing system for testing a plurality of DUTs (device under test) on a wafer, the plurality of DUTs arranged in an n*m matrix, each DUT having a row testing end and a column testing end, and the testing system comprising:

n row testing pads for receiving a testing signal, wherein n is not less than 2, a row testing pad of the first row is coupled to the row testing ends of the DUTs arranged on the first row, and a row testing pad of the nth row is coupled to the row testing ends of the DUTs arranged on the nth row; and m column testing pads for receiving a testing signal, wherein m is not less than 2, a column testing pad of the first column is coupled to the column testing ends of the DUTs arranged on the first column, and a column testing pad of the mth column is coupled to the column testing ends of the DUTs arranged on the mth column; and a testing device, coupled to the n row testing pads and the m column testing pads, for detecting a plurality of electronic parameters corresponding to a plurality of sets of two different testing pads and comparing the electronic parameters to detect a specific device from the DUTs.

15. A testing method for testing a plurality of DUTs (device under test) on a wafer comprising:

arranging the plurality of DUTs in an n*m matrix, wherein each DUT has a row testing end and a column testing end;

providing n row testing pads, coupling a row testing pad of the first row to the row testing ends of the DUTs arranged on the first row, and coupling a row testing pad of the nth row is coupled to the row testing ends of the DUTs arranged on the nth row, wherein m is not less than 2; and providing m column testing pads, coupling a testing pad of the first column to the column testing ends of the DUTs arranged on the first column, and coupling a testing pad of the mth column is coupled to the column testing ends of the DUTs arranged on the mth column, wherein m is not less than 2; and detecting a plurality of electronic parameters corresponding to a plurality of sets of two different testing pads and comparing the electronic parameters to detect a specific device from the DUTs.

* * * * *